United States Patent [19]

Woith et al.

[11] Patent Number: 5,777,484
[45] Date of Patent: Jul. 7, 1998

[54] DEVICE FOR TESTING INTEGRATED CIRCUIT CHIPS DURING VIBRATION

[75] Inventors: Blake F. Woith, Santa Ana; Haim Feigenbaum, Irvine; John Steven Szalay, Corona Del Mar, all of Calif.

[73] Assignee: Packard Hughes Interconnect Company, Irvine, Calif.

[21] Appl. No.: 720,589

[22] Filed: Sep. 30, 1996

[51] Int. Cl.$^6$ ............................................. G01R 31/02
[52] U.S. Cl. ................................. 324/754; 324/755
[58] Field of Search ............................ 324/754–769, 324/158.1; 73/663, 664

[56] References Cited

U.S. PATENT DOCUMENTS

| | | | |
|---|---|---|---|
| 4,981,817 | 1/1991 | Stone, Jr. | 437/206 |
| 5,369,358 | 11/1994 | Metzger et al. | 324/754 |
| 5,414,372 | 5/1995 | Levy | 324/765 |
| 5,435,533 | 7/1995 | Weinmann, Jr. | 269/228 |
| 5,436,571 | 7/1995 | Karasawa | 324/765 |
| 5,637,907 | 6/1997 | Leedy | 257/434 |
| 5,663,654 | 9/1997 | Wood et al. | 324/758 |
| 5,677,203 | 10/1997 | Rates | 437/8 |
| 5,679,977 | 10/1997 | Khandros et al. | 257/692 |

*Primary Examiner*—Ernest F. Karlsen
*Assistant Examiner*—Russell M. Kobert
*Attorney, Agent, or Firm*—Cary W. Brooks

[57] ABSTRACT

The invention includes a testing apparatus for testing integrated circuit chips during vibration. The apparatus includes a vibration fixture base which is a table that can be vibrated vertically and/or horizontally. The base supports a holding fixture for supporting a flexible circuit having circuit traces whose ends terminate in raised dots or bumps. The flexible circuit is clamped to the holding fixture to properly position the raised features at the end of the circuit traces. A holder and clamp unit holds a plurality of integrated circuit chips and clamps the chips against the bumps on the flexible circuit with predetermined pressure to make electrical contact between pads on the integrated circuit chip and the bumps. The clamp unit can be raised and lower and rotated. Even pressure is assured by a compressible layer carried in the fixture and located beneath the bumps. The contact points of the bumps and the integrated circuit chip pads vibrate in unison during vibration testing. Firm clamping pressure provided by the compressible layer and the clamp eliminates damage to the chip under vibration testing.

5 Claims, 1 Drawing Sheet

DEVICE FOR TESTING INTEGRATED CIRCUIT CHIPS DURING VIBRATION

TECHNICAL FIELD

The invention relates to vibration testing devices, and particularly for devices for testing integrated circuit chips.

BACKGROUND OF THE INVENTION

Integrated circuit chips are used in a variety of applications and in particularly in electronic devices for automobiles. It is desirable to test the integrated circuit chips in a simulated vibration environment that might occur in an automobile or other vehicle. Further, it is desirable to conduct the testing utilizing a temporary connection to the integrated circuit chip for easy insertion in and removal from the testing equipment and without damaging the chip. Heretofore, needle-like probes have been used to make contact to pads on the integrated circuit chips to conduct vibration testing. However, often the long, thin needle probes moved substantially during vibration and damaged the integrated circuit chip.

The present invention provides advantages and alternatives over the prior art.

SUMMARY OF THE INVENTION

The invention includes a testing apparatus for testing integrated circuit chips during vibration. The apparatus includes a vibration fixture base which is a table that can be vibrated vertically and/or horizontally. The base supports a holding fixture for supporting a flexible circuit having circuit traces whose ends terminate in raised dots or bumps. The flexible circuit is clamped to the holding fixture to properly position the raised features at the end of the circuit traces. A holder and clamp unit holds a plurality of integrated circuit chips, and clamps the chips against the bumps on the flexible circuit with predetermined pressure to make electrical contact between pads on the integrated circuit chip and the bumps. The clamp unit can be raised and lowered and rotated. Even pressure is assured by a compressible layer carried in the fixture and located beneath the bumps. The contact points of the bumps and the integrated circuit chip pads vibrate in unison during vibration testing. Firm clamping pressure provided by the compressible layer and the clamp eliminates damage to the chip under vibration testing.

These and other objects, features and advantages will become apparent from the following brief description of the drawings, detailed description and appended claims and drawings.

DETAILED DESCRIPTION

Figure 1:
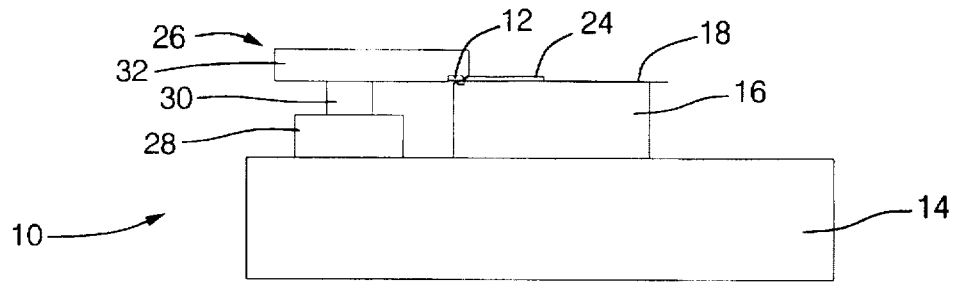
FIG. 1 is a schematic illustration of a testing apparatus according to the present invention.
Figure 2:
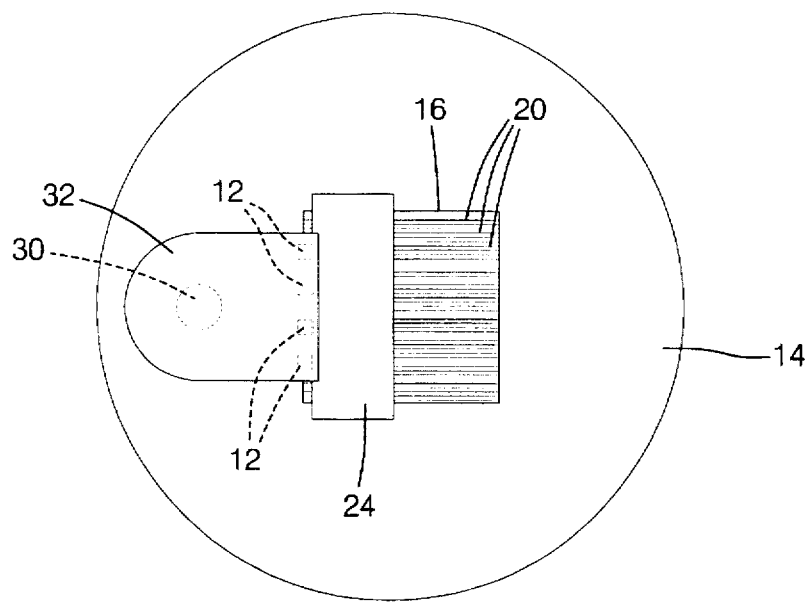
FIG. 2 is a top view of a testing apparatus according to the present invention.
Figure 3:
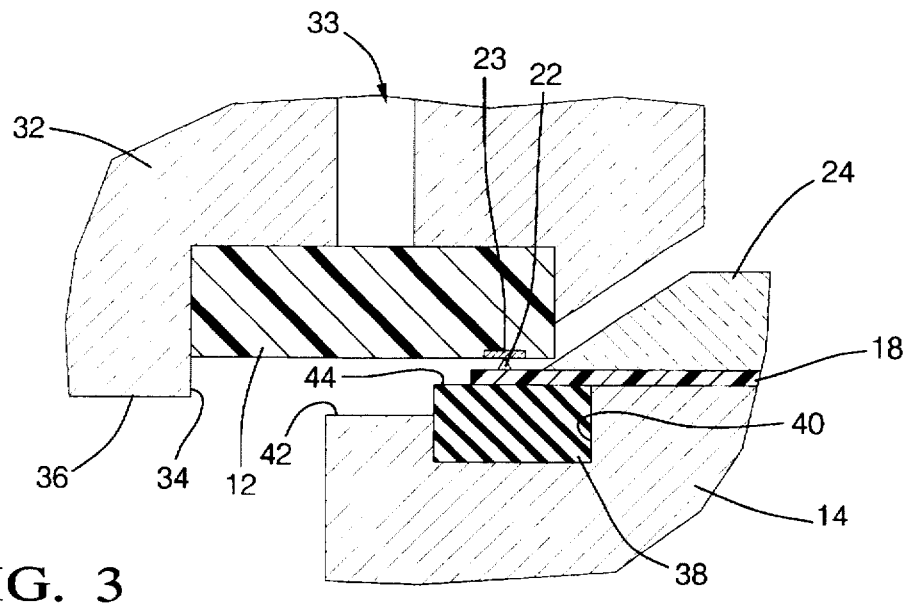
FIG. 3 is an enlarged portion of FIG. 1.

FIG. 1 illustrates a testing apparatus 10 for testing integrated circuit chips 12 during vibration according to the present invention. The apparatus includes a vibrational fixture base 14 which is a table that can be vibrated vertically and/or horizontally using methods known to those skilled in the art. The base supports a holding fixture 16 for supporting a flexible circuit 18 having circuit traces 20 whose ends terminate in raised contact features or bumps 22. The flexible circuit is secured to the holding fixture preferably by a clamp 24 to position the bumps of the ends of the circuit traces. The clamp 24 may be secured to the holding fixture 16 by any method known to those skilled in the art such as by bolts, screws and quick release mechanisms (not shown). A hold and clamp unit 26 holds a plurality of integrated circuit chips 12 and clamps the chips against the bumps 22 of the flexible circuit with predetermined pressure to make electrical contact between electrical contact pads (not shown) on the integrated circuit chip and the bumps. The hold and clamp unit 26 includes a driver 28 for raising and lowering a shaft 30, and for pivotally rotating a head 32. The hold and clamp unit may include a vacuum for picking and placing the integrated circuit chips in production line testing. Preferably, the head 32 has a well 34 formed in a lower surface 36 for receiving individual integrated circuit chips 12. Even pressure is assured across all of the integrated circuit chip pads by the use of a compressible or elastomeric pad 38 such as foam rubber carried in the fixture and located beneath the bumps. Preferably, the fixture includes a well 40 defined therein for holding the pad 38 and has a top surface 42 spaced a distance from the top surface 44 of the pad so that pad 38 can be compressed without the chip 12 or head 32 bottoming out on the fixture 16. Alternatively, the clamp and hold unit 26 and the holding fixture 16 for the flexible circuit, or other components, may be inverted to produce the same results. Damage at the point of contact between the bumps and the contact pads on the integrated circuit chips associated with movement of the integrated circuit chip or the bumps during vibration is substantially reduced or eliminated by the energy absorbing compressible layer underneath the bumps and the clamping force of the unit 26.

A flexible circuit having raised contact features or bumps can be made by a variety of methods including producing a flexible circuit with contact pads and mechanically forcing a tool into the contact pad to produce a raised electrically conductive feature. An alternative method of making a flexible circuit is described in Crumly et al, U.S. Pat. No. 5,207,887, entitled "Semi-Additive Circuitry with Raised Features Using Formed Mandrels", issued May 4, 1993, the disclosure of which is hereby incorporated by reference. The Crumly et al process is briefly described hereafter.

A stainless steel plate forms a mandrel having a forming surface in which is provided one or a plurality of depressions or dimples, which will define raised features of the resulting circuitry. The mandrel and its depression or depressions is then coated with a copper coating, typically referred to as flash plated, which covers the entire surface of the mandrel, including the surface of the depressions. The flash plated copper is applied by electroplating or other known techniques and provides a thin conductive coating that prevents the adhesive (that will be used to laminate the circuit substrate) from adhering to the mandrel surface. Flash plating is a conventional electrolytic plating formed in a very short or momentary operation so that only a very thin plating coat is provided. The flash plated coat is very thin compared to the thickness of the electrical circuit traces that are made. For example, for a circuit trace of 1 ½ mil thickness, a flash plating of copper on the mandrel will have a thickness of 0.01 to 0.2 mils. The thin flash plating is employed because it can be relatively easily released from the stainless steel mandrel, and, in addition, may be readily removed from the lamination after separation from the mandrel by a flash etching, which is a very short time or momentary etching process. Obviously, other methods for coating the mandrel with a very thin coat of conductive material that is readily separable from the mandrel and which can be readily removed from the completed circuit traces may be employed in the place of the electrolytic flash plating. Such methods may include sputtering, vapor deposition and electroless plating. If deemed necessary or desirable, the mandrel may be made of a non-electrically conductive material because the thin electrically conductive coating itself enables the additive electroplating of the circuit traces and raised features. The coating, for a dielectric mandrel, can be applied by electroless plating, puttering, or additional conductive particles in solution. No pattern of non-conductive material, such as Teflon, is permanently affixed to the mandrel. Instead, the flash plated copper is coated with a photoresist, which is then optically exposed through a mask defining a pattern of the desired circuit and developed. The photoresist that has not been polymerized is then removed to leave the partially completed assembly in the configuration illustrated. The flash plated copper coating now bears a pattern of photoresist that is a negative pattern of the circuit trace pattern to be fabricated with this mandrel.

The mandrel assembly is then subjected to a suitable additive electroforming process, such as, for example, electroplating, to plate up copper traces, including trace and a raised feature pad, including a raised feature in the depression. The copper traces are plated directly onto those portions of the flash plated copper coating that are not covered by the negative pattern of developed photoresist. Thus the plating process simultaneously forms both the circuit traces and the raised features. The raised features are partly hollow, having a depression or dimple. If deemed necessary or desirable, the depress formed in the electroplated raised feature may be filled with a solid material by placing a dollop of epoxy in the depression and then allowing the epoxy to cure.

The photoresist is then stripped to leave the circuit traces and raised features on the flash plated copper coating which is still on the mandrel. Now a layer of a suitable dielectric and adhesive, such as, for example, a layer of and an adhesive, are laminated to the mandrel assembly with the traces and circuit features thereon under suitable high temperatures and pressures. This causes the Kapton and adhesive to flow into the spaces between the traces and thereby contact traces and pads on three sides. Only that side of the traces and pads that is directly in contact with the flash plated copper on the mandrel is not contacted by the adhesive/Kapton® substrate. The assembly now includes the mandrel, the flash plated copper, traces, pads and features, and the Kapton®/adhesive substrate.

The circuit assembly is then removed from the mandrel. Because only the flash plated copper contacts the mandrel, this may be readily separated, and no adhesive of the substrate is in contact with the mandrel. Thus it will be seen that because the mandrel has been initially coated with the protective layer of the flash plated copper, the assembly of dielectric/adhesive substrate and circuit traces and raised features can be readily separated from the mandrel, together with the flash plated copper coating.

After separation from the mandrel, the flash plated copper coating, which covers the entire lower surface of the assembly is removed by a flash etching process to yield the finished or substantially finished sub-assembly. The sub-assembly is ready for the coverlay lamination, which comprises the standard process for covering at least the side of the sub-assembly bearing the conductive traces with an insulative coverlay.

If deemed necessary or desirable, the removal of the flash plated copper coating may be controlled by a "stop" layer of gold or nickel, which will protect the thicker copper circuit during flash etch removal of the flash plated copper. To this end, the flash coated mandrel with its photolithographically defined resist pattern in place, may be plated with a think layer of gold, about 0.00006 inches thick, upon which the circuitry will be plated. This patterned gold "stop" layer allows the flash plated copper to be removed by the flash etching from the dielectric, but protects the copper circuit.

We claim:

1. A testing apparatus for testing integrated circuit chips during vibration comprising:

a vibration fixture base constructed and arranged to be vibrated vertically and horizontally;

a holding fixture mounted on the base for supporting a flexible circuit having electrical traces whose ends terminate in raised contact features, a clamp for securing the flexible circuit to position the raised contact features, a holder and clamp unit for holding a plurality of integrated circuit chips and clamping the chips against the raised contact features of the flexible circuit with predetermined pressure to make electrical contact between contact pads on the integrated circuit chips and the raised contact features, the holder and clamp unit being capable of being raised, lowered and rotated, and a compressible pad carried by the fixture and located underneath the raised contact feature.

2. A testing device as set forth in claim 1 wherein the compressible pad extends above a top surface of the fixture to prevent the unit or a chip carried by the unit from bottoming out on the fixture.

3. A testing device as set forth in claim 1 further comprising a clamp for securing the flexible circuit to the holding fixture and positioning the raised features.

4. A test device as set forth in claim 1 wherein the holder and clamp unit further comprises a vacuum means for picking up and placing integrated circuit chips.

5. A testing apparatus for testing semiconductor devices during vibration comprising:

a vibration fixture base constructed and arranged to be vibrated vertically and horizontally;

a holding fixture mounted on the base for supporting a flexible circuit having electrical traces whose ends terminate in raised contact features, a clamp for securing the flexible circuit to position the raised contact features, a holder and clamp unit for holding a plurality of semiconductor devices and clamping the semiconductor devices against the raised contact features of the flexible circuit with predetermined pressure to make electrical contact between contact pads on the semiconductor devices and the raised contact features, the holder and clamp unit including a shaft and a pick-up head and a driver for raising and lowering the shaft and for pivotally rotating the head, and a compressible pad carried by the fixture and located underneath the raised contact feature.

* * * * *